United States Patent
Chan et al.

(10) Patent No.: US 7,847,597 B1
(45) Date of Patent: Dec. 7, 2010

(54) PRECISION FREQUENCY CHANGE DETECTOR

(75) Inventors: Yat C. Chan, Cerritos, CA (US); James C. Camparo, Redondo Beach, CA (US); Walter A. Johnson, San Jose, CA (US); Christine Humphries, legal representative, San Jose, CA (US); Albert M. Young, Whittier, CA (US); Sarunas K. Karuza, Rolling Hills Estates, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 12/456,287

(22) Filed: Jun. 15, 2009

(51) Int. Cl.
*G01R 23/02* (2006.01)
*H03D 3/00* (2006.01)
*H03K 9/06* (2006.01)

(52) U.S. Cl. .................. 327/47; 329/336; 708/311; 455/214; 324/76.41

(58) Field of Classification Search .................. 327/47; 324/76.41; 329/327, 336; 455/119, 214, 455/304; 708/311
See application file for complete search history.

(56) References Cited

U.S. PATENT DOCUMENTS

| | | | | | |
|---|---|---|---|---|---|
| 4,336,505 | A | * | 6/1982 | Meyer | 331/1 R |
| 4,754,228 | A | * | 6/1988 | Tomlinson | 329/336 |
| 4,780,667 | A | * | 10/1988 | Reese et al. | 324/76.79 |
| 5,568,305 | A | * | 10/1996 | Naito et al. | 455/214 |
| 6,396,338 | B1 | * | 5/2002 | Huang et al. | 329/336 |
| 6,847,255 | B2 | * | 1/2005 | Petrovic et al. | 329/323 |

* cited by examiner

*Primary Examiner*—Lincoln Donovan
*Assistant Examiner*—Patrick O'Neill

(57) ABSTRACT

A frequency change detector splits a frequency standard signal into two undelayed frequency signals, one of which is delayed by a predetermined amount. The delayed signal is then mixed with the undelayed frequency signal into a mixed signal that is further filtered and amplified for providing an output signal indicating frequency changes of the frequency standard signal. The mixed frequency signal indicates frequency changes of the original frequency standard signal without reference to another frequency standard. This frequency change detector is well suited for use on satellites as an early warning detection of changes in on-board atomic frequency standards.

14 Claims, 1 Drawing Sheet

ATOMIC FREQUENCY STANDARD FREQUENCY CHANGE DETECTOR

ATOMIC FREQUENCY STANDARD FREQUENCY CHANGE DETECTOR

PRECISION FREQUENCY CHANGE DETECTOR

STATEMENT OF GOVERNMENT INTEREST

The invention was made with Government support under contract No. FA8802-04-C-0001 by the Department of the Air Force. The Government has certain rights in the invention.

FIELD OF THE INVENTION

The invention relates to the field of oscillators. More particularly, the present invention relates to a detector for detecting frequency changes.

BACKGROUND OF THE INVENTION

Atomic frequency standards and high performance crystal oscillators are used in navigation and communication satellite systems. For example, GPS satellites use rubidium (Rb) atomic frequency standards or cesium (Cs) atomic frequency standards to generate signals in space with a very precise frequency for GPS users. Although atomic frequency standards are well known for their frequency precision and stability, atomic frequency standards are also known to exhibit slight, but nonetheless significant, frequency jumps, caused by either environmental and external or internal clock physics perturbations. In the GPS system, an unintended fractional frequency jump could produce a large user range error after just a few seconds. Following a frequency jump, it is consequently desirable to quickly determine the magnitude of the frequency jump, identify the source of the jump, and if needed, apply corrective actions.

Currently, the GPS ground station monitors the health of the GPS satellite by post-processing the satellite signals. Clock frequency corrections and health status are uploaded to the satellites daily. However, for a moderate sized frequency jump, the user range error could build up to an unacceptably high level in less than a day, negatively affecting some precision navigation applications. It is therefore desirable to have an on-board system to autonomously and continuously monitor the performance of the frequency standard and alert the user, or take the satellite out of the navigation solution, if frequency jumps exceed a critical level. Frequency jump detection is a difficult problem, without a viable solution. These and other disadvantages are solved or reduced by using the invention.

SUMMARY OF THE INVENTION

An object of the invention is to provide a detector for detecting frequency changes.

Another object of the invention is to provide a detector for detecting frequency changes of atomic frequency standards.

Yet another object of the invention is to provide a detector for detecting frequency changes of atomic frequency standards using a predetermined delay.

Still another object of the invention is to provide a detector for detecting frequency changes of a frequency standard signal using a predetermined delay for mixing the frequency standard signal with a delayed replica of the frequency standard signal.

A further object of the invention is to provide a detector for detecting frequency changes of a frequency standard signal using a predetermined delay for mixing the frequency standard signal with a delayed replica of the frequency standard signal for providing an output indicating an amount of frequency change.

The present invention is directed to a frequency change detector. The frequency change detector can be applied for monitoring frequency changes of an atomic frequency standard signal. A frequency standard signal is split into two frequency signal replicas. One of the frequency signal replicas is delayed by a predetermined delay as a conversion into a delayed frequency signal. The frequency signal replica and the delay frequency signal are mixed together forming a mixed frequency signal. The mixed frequency signal is filtered into a filtered frequency signal. The filtered frequency signal is amplified into an output detection signal. The output detection signal indicates changes in the frequency of the frequency standard signal. The frequency change detector can be used on satellites as an early warning detection of the changes in on-board atomic frequency standards.

The detector is a compact design that can be used to measure the output stability of a frequency standard such as an atomic clock or a high performance crystal oscillator. The detector is ideal for use in monitoring the performance of frequency sources used in navigation and communication satellite systems, as well as in other space or ground applications that require ultra-stable frequency sources. These and other advantages will become more apparent from the following detailed description of the preferred embodiment.

DETAILED DESCRIPTION OF THE PREFERRED EMBODIMENT

Figure 1:
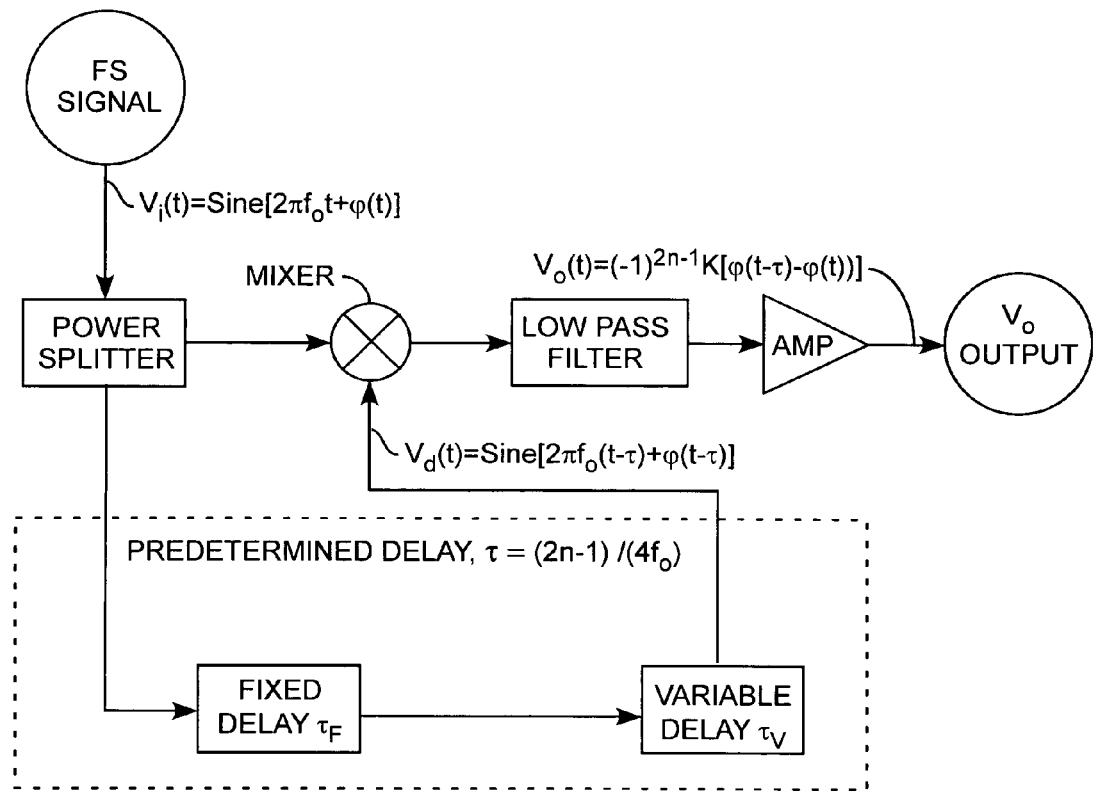
FIG. 1 is a schematic of a frequency change detector.

An embodiment of the invention is described with reference to the figure using reference designations as shown in the figure. Referring to the Figure, a frequency standard signal $V_i(t)=\text{sine}[2\pi f_o t+\phi(t)]$ is connected to a power splitter providing two identical undelayed frequency signals $V_u$ of lower power than the frequency standard signal input $V_i$, where t is time, where $f_o$ is the center frequency of the frequency standard signal, and where $\phi(t)$ is the phase at time t. Both undelayed frequency signals $V_u$ from the power splitter have the same frequency as the input frequency standard signal $V_i(t)$.

A first one of the undelayed frequency signals $V_u$ is fed into a predetermined delay $\tau$, which is equal to $(2n-1)/(4f_o)$, where n is an integer. The predetermined delay preferably includes a fixed delay $\tau_F$ and a variable delay $\tau_V$. The predetermined delay provides for a predetermined phase shift. Hence, the predetermined delay is matched to the center frequency $f_o$ of the frequency standard signal in order to provide a null output signal of the device when there is no frequency change. The fixed delay provides a large time delay of the frequency standard signal. The variable delay provides a small delay of the frequency standard signal. The use of a fixed delay and a variable delay allows for precision setting of the predetermined delay that can be precisely measured for empirical precision setting of the predetermined delay $\tau$. The predetermined delay provides a delayed frequency signal $V_d(t)=\text{sine}[2\pi f_o(t-\tau)+\phi(t-\tau)]$ where $\phi(t-\tau)$ is the phase at time $t-\tau$, and $\tau$ is the total time delay of the predetermined delay. Hence, $V_d(t)$ is the delayed frequency signal at time t.

The delayed frequency signal $V_d$ and the second undelayed frequency signal $V_u$ of the frequency standard signal are mixed together by the mixer for providing a mixed frequency signal. The mixed frequency signal is filtered by a low pass filter into a filtered frequency signal. The filtered frequency signal is amplified by a low noise amplifier into an output signal $V_o$ where $V_o(t)=K[\phi(t-\tau)-\phi(t)]$, where K is a constant and has a value depending on the amount of filtering and amplification. $V_o(t)$ is the output signal of the frequency change detector. The output signal indicates changes in the instantaneous frequency of the frequency standard signal.

The detector is a self-correlation detector used to monitor the stability of the frequency standard signal from a frequency source. The delayed frequency signal $V_d$ is mixed with an undelayed frequency signal for generating an output signal indicating phase shifting that is an indication of frequency changes or jumps. For the relatively small frequency jumps in the frequency sources of interest, the steady state output signal of the mixer will be proportional to the phase difference between the undelayed frequency signal $V_u$, and the delayed frequency signal $V_d$. Hence, the output voltage $V_o$ changes in proportion to the frequency change, and can return to zero when the frequency changes have stopped and returned to the original frequency. Integrating the output voltage can produce a permanent signal that increases during the settling time after the initial frequency jump, and thereafter maintains a fixed non-zero value. The voltage output $V_o$ can also be digitized and stored over time for digital recording of frequency changes that can be time stamped. The amount, time, and frequency of the frequency jumps can then be determined from a calibration of the output voltage.

Various delays can be used as the predetermined delay. In the preferred form, a combination of a coarse delay and fine delay can be coupled together in series for providing a predetermined precision delay. The predetermined delay can be realized from various designs. For example, the fixed delay can be generated by a temperature stabilized crystal filter. A high Q crystal filter can be used as the predetermined fixed delay. In other embodiments, the fixed delay can take the form of any electronic dispersive element. In still other embodiments, the fixed delay can take the form of any object that causes a fixed phase change in the signal relative to the undelayed frequency signal. Examples of such objects would include, but would not be limited to, cables, optical fibers, and resonant media that result in slow-light. Various built in delays can be used with computer selection circuits for adjusting the amount of the delay by adjusting fine delays over time as the frequency standard degrades and shifts in frequency over time in an adaptable process.

Various signals can be used as the input signal $V_i(t)$. In the preferred embodiment, the input signal is from a precision frequency standard in the radio frequency range. Precision frequency standards for the preferred embodiment would include, but would not be limited to, atomic frequency standards and crystal oscillators. In other embodiments of the invention, the input signal could come from any signal source in any range of the electromagnetic spectrum. Signal sources for other embodiments of the invention could include, but would not be limited to, lasers.

The detector can detect fractional frequency jumps as low as $1\times 10^{-11}$ Hz. For the preferred signal source, this level of fractional frequency jump corresponds to 100 microhertz. The detection limit can be improved with optimization. From the patterns of output signal and from telemetry of the frequency standard, one can distinguish the source of the frequency jumps as arising either from an atomic system or an internal crystal oscillator of the atomic clock. In the preferred embodiment, the predetermined delay $\tau$ is preferably set to be greater than 1 millisecond (ms) and can be large, for example, up to 100,000. The longer the delay, the better is the indication of the frequency changes over time. In general, $\tau=\tau_F+\tau_v=(2n-1)/4f_o$, where $0<\tau_v<1/4f_o$ in seconds for a delay of 90°.

For a 10 MHz frequency standard, $1/f_o$ is 100 ns. A crystal filter can provide as large as 10 ms delay as the fixed delay. A phase adjuster, in 25 ns selectable increments, can be used as the variable fine delay. At 10 MHz, ¼ of a cycle is 25 ns. The variable fine delay can be varied from zero to 100 ns to be precisely matched with fixed delay so that the total predetermined delay $\tau$ is a large number, for example, 100,000 plus ¼ or ¾ cycles of the frequency of the frequency standard signal.

The fixed and variable delays sum so that the delayed frequency signal is 90° phase shifted from the undelayed frequency signal so that the mixing of the delayed frequency signal with the undelayed frequency is zero during a stable frequency time, but changes when a frequency shift occurs, because the undelayed frequency signal is now off of a precise 90° phase shift of the delayed frequency signal. The output voltage will change, by increasing or decreasing, depending on the phase polarity, until the predetermined delay is reached as the delayed signal frequency eventually approaches the undelayed signal frequency when the phase difference between the delayed and undelayed signal stops increasing and starts decreasing toward steady state zero.

The frequency change detector provides frequency change sensitivity at low cost and is ideal for use as a GPS atomic frequency standard integrity monitoring system. The detector can also be used in communication satellite systems that require ultrastable frequency sources. The detector also provides a single-point assessment of an atomic frequency source Allan variance, Because the invention is essentially measuring frequency fluctuations over the interval $\tau$. This detection and measuring device can be useful in monitoring the integrity of an atomic frequency system. Those skilled in the art can make enhancements, improvements, and modifications to the invention, and these enhancements, improvements, and modifications may nonetheless fall within the spirit and scope of the following claims.

What is claimed is:

1. A detector for detecting changes in a frequency of a frequency signal, the detector comprising,
    a splitter for splitting the frequency signals into a first undelayed signal and a second undelayed signal,
    a delay for delaying by a predetermined amount of a predetermined delay the second undelayed signal to produce a delayed signal,
    a mixer for mixing together the delayed signal and first undelayed signal for providing a mixed signal, the mixed signal changing over time as the frequency of the frequency signal changes over time,
    the frequency of the frequency signal has a predetermined center frequency, the frequency signal being $V(t)=\text{sine}[2\pi f_o t+\phi(t)]$,
    the predetermined center frequency is $f_o$,
    the predetermined delay is T equaling $(2n-1)/4f_o$, n being an integer, and
    the delayed signal is $Vd(t)=\text{sine}[2\pi f_o(t-T)+\phi(t-T)]$, and the delay comprises a coarse delay for $2n/4f_o$ and fine delay for $1/4f_o$.

2. The detector of claim 1 further comprising, a filter for filtering the mixed signal into a filtered signal.

3. The detector of claim 1 further comprising, a filter for filtering the mixed signal into a filtered signal, and
    an amplifier for amplifying the filtered signal into an output signal, the output signal changing over time as the frequency of the frequency signal changes over time.

4. The detector of claim 1 further comprising, a filter for filtering the mixed signal into a filtered signal, and an amplifier for amplifying the filtered signal into an output signal, the output signal being zero when the frequency of the frequency signal is not changing over time.

5. The detector of claim 1, wherein,
the coarse delay being a fixed delay, and
the fine delay being a selectable variable delay.

6. The detector of claim 1, wherein,
the coarse delay being a fixed delay, and
the coarse delay being a crystal filter.

7. The detector of claim 1, wherein,
the frequency changes of the frequency of the frequency signal being characterized by change in the phase $\phi$ at time t.

8. A detector for detecting changes in a frequency of a frequency signal, the detector comprising,
a splitter for splitting the frequency signals into a first undelayed signal and a second undelayed signal,
a delay for delaying by a predetermined amount of a predetermined delay the second undelayed signal to produce a delayed signal, the delay comprising a coarse delay and fine delay summing to the predetermined delay,
a mixer for mixing together the delayed signal and first undelayed signal for providing a mixed signal,
a filter for filtering the mixed signal into a filtered signal,
an amplifier for amplifying the filtered signal into an output signal, the output signal changing over time as the frequency of the frequency signal changes over time,
wherein the frequency of the frequency signal has a predetermined center frequency, the frequency signal being $Vi(t)=\text{sine}[2\pi f_o t+\phi(t)]$,
the predetermined center frequency is $f_o$,
the predetermined delay is T equaling $(2n-1)/4f_o$, n being an integer,
the delayed signal is $Vd(t)=\text{sine}[2\pi f_o(t-T)+\phi(t-T)]$, and
the delay comprises the coarse delay for $2n/4f_o$ and the fine delay for $1/4f_o$.

9. The detector of claim 8 wherein,
the output signal is $Vo(t)=K[\phi(t-T)-\phi(t)]$, where K is a constant, K having a value depending on the amount of filtering of the filter and the amount of amplification by the amplifier.

10. The detector of claim 8 wherein,
n is greater than 200,000, and
the predetermined delay is greater than 10 ms.

11. The detector of claim 8 wherein,
the center frequency $f_o$ being 10 MHz where $\phi$ is a relative phase shift of the frequency signal,
n being equal to 200,000,
the coarse delay is 10 ms, and
the fine delay is 25 ns.

12. The detector of claim 8 wherein,
the frequency signal is provided by an atomic clock.

13. The detector of claim 8 wherein,
the frequency signal is provided by an atomic clock on a satellite.

14. The detector of claim 8 wherein,
the predetermined delay is greater than 1 ms.

\* \* \* \* \*